United States Patent [19]

Asano

[11] Patent Number: 4,968,384

[45] Date of Patent: Nov. 6, 1990

[54] METHOD OF PRODUCING CARBON-DOPED AMORPHOUS SILICON THIN FILM

[75] Inventor: Akihiko Asano, Kanagawa, Japan

[73] Assignee: Fuji Electric Corporate Research and Development Ltd., Kanagawa, Japan

[21] Appl. No.: 407,300

[22] Filed: Sep. 14, 1989

[30] Foreign Application Priority Data

Sep. 29, 1988 [JP] Japan .................................. 63-244794

[51] Int. Cl.$^5$ ...................... H01L 21/306; B44C 1/22; C03C 15/00; C03C 25/06
[52] U.S. Cl. .................................. 156/643; 156/646; 156/657; 156/662; 204/192.3; 204/192.37; 427/38; 437/228
[58] Field of Search ............... 156/628, 643, 646, 657, 156/662; 204/192.25, 192.3, 192.37; 136/258; 427/38, 39; 437/2, 46, 228, 240

[56] References Cited

U.S. PATENT DOCUMENTS 4,599,135  7/1986  Tsunekawa et al. ................ 156/643

OTHER PUBLICATIONS

A. Asano, T. Ichimura, Y. Uchida and H. Sakai, Characterization of $\alpha$-Si$_{1-x}$C$_x$:H/$\alpha$-Si:H and $\alpha$-Si:H and $\alpha$-SiN:H/$\alpha$-Si:H Heterojunctions by Photothermal Deflection Spectroscopy, J. Appl. Phys. 63(7), Apr. 1, 1988, pp. 2346-2351.

*Primary Examiner*—William A. Powell
*Attorney, Agent, or Firm*—Finnegan, Henderson, Farabow, Garrett, and Dunner

[57] ABSTRACT

A method of producing a carbon-doped amorphous silicon thin film upon a substrate comprising the steps of growing a carbon-doped amorphous silicon layer by plasma assisted chemical vapor deposition, including generating a glow discharge in a gaseous mixture of a silane gas and a hydrocarbon gas, and exposing said carbon-doped amorphous silicon layer to a plasma in a gas containing hydrogen to achieve a resultant layer having a prescribed value of photoconductivity.

5 Claims, 2 Drawing Sheets

METHOD OF PRODUCING CARBON-DOPED AMORPHOUS SILICON THIN FILM

BACKGROUND OF THE INVENTION

1. Field of the Invention

The present invention relates to a method of producing a carbon-doped amorphous silicon thin film to be used as a material of a light incident layer (i.e., window layer) of an amorphous solar battery.

2. Description of the Related Art

In an amorphous solar battery, it is necessary to reduce the optical absorption coefficient of the window layer so as to allow as much incident light as possible to reach the layer of the solar battery having a photoelectric conversion function. In order to reduce the absorption coefficient of the window layer, it is necessary that the window layer have a large optical band gap. It is sufficient that the window layer of an amorphous silicon solar battery be comprised of a carbon-doped amorphous silicon thin film having an optical band gap larger than that of the materials comprising the solar battery itself. Conventionally, such a carbon-doped amorphous silicon thin film has been produced in the following manner.

First, a gaseous mixture of a mono-silane gas ($SiH_4$) and an acetylene gas ($C_2H_2$) is led into a vacuum chamber so as to make the pressure in the chamber 10-1000 Pa Next, a 13.56 MHz high frequency electric field is applied across a pair of parallel-plate electrodes disposed in the vacuum chamber so that a glow discharge is generated across the electrodes. The gaseous mixture is decomposed by energy from the glow discharge, and a carbon-doped amorphous silicon thin film is deposited on a substrate which has been placed in the vacuum chamber and heated to 150°-300° C. The carbon concentration x in the film is a function of the ratio of the acetylene flow rate $F(C_2H_2)$ to the mono-silane flow rate $F(SiH_4)$, and is represented by equation (1) based on data presented by Asano et al. in *Journal of Applied Physics*, Vol. 63 (1989), No. 7, p. 2346.

$$x = 0.68[F(C_2H_2)/F(SiH_4)]^{0.466} \tag{1}$$

Further, the magnitude of the optical band gap Eg (unit: electron volt) of the film is a linear function of the carbon concentration x in the film, and is represented by equation (2).

$$Eg = 1.72 + 1.54x \tag{2}$$

Therefore, the optical band gap of the formed carbon-doped amorphous silicon thin film can be successively altered by varying the mixing ratio of monosilane to acetylene in the raw material gas.

In the conventional method for producing such a carbon-doped amorphous silicon thin film, however, there are disadvantages in that the defect density of the resultant carbon-doped amorphous silicon thin film sharply increases as the carbon concentration in the carbon-doped amorphous silicon thin film increases. This leads to a deterioration of the film's photoelectric characteristics such as electric conductivity (photoconductivity) or the like. The photoconductivity of a carbon-doped amorphous silicon thin film having an optical band gap, for example, of 2.0 electron volts is low, about $10^{-8}$ s/cm while under irradiation of an artificial sun having intensity of 100 mW/cm$^2$.

SUMMARY OF THE INVENTION

Accordingly, it is an object of the present invention to provide a method of producing a carbon-doped amorphous silicon thin film having substantially the same or increased photoconductivity as that of a low-defect, carbon free, amorphous silicon thin film produced by a conventional plasma assisted chemical vapor phase growth process.

Additional objects and advantages of the invention will be set forth in the description which follows and, in part, will be apparent from the description To achieve the foregoing objects, and in accordance with the purposes of the invention as embodied and broadly described here, a method of producing a carbon-doped amorphous silicon thin film comprising a step of plasma assisted chemical vapor growth in which glow discharge is generated in a gaseous mixture of a silane series gas and a hydrocarbon series gas so that a carbon-doped amorphous silicon layer of predetermined thickness is deposited on a substrate, and a step of hydrogen plasma treatment in which the deposited carbon-doped amorphous silicon layer is exposed to plasma generated by glow discharge in a gas containing hydrogen.

In a preferred embodiment, the above steps are alternately repeated such that the thickness of the resulting carbon-doped amorphous silicon layer after each deposition and hydrogen plasma treatment step is less than 0.8 nm.

The introduction of hydrogen plasma acts to reduce the defect density in carbon-doped amorphous silicon films having a thickness less than about 0.8 nm corresponding to a depth from the growth surface of less than 3 atomic layers. Therefore, the entire carbon-doped amorphous silicon thin film formed by alternately repeating the plasma CVD step of depositing a carbon-doped amorphous silicon layer having a thickness less than 0.8 nm, and the step in which the carbon-doped amorphous silicon layer is subject to hydrogen plasma treatment, has few defects, and, consequently, high photoconductivity. Further, hydrogen plasma can be used to etch a carbon-doped amorphous silicon thin film so that the same effects as described above can be obtained in the case where a carbon-doped amorphous silicon layer having a thickness of 0.8 nm or more is deposited. Through hydrogen plasma treatment, the thickness of the carbon-doped amorphous silicon layer can be etched to less than 0.8 nm.

BRIEF DESCRIPTION OF THE DRAWINGS

The accompanying drawings illustrate presently preferred embodiments and method of the invention and, together with the general description given and the detailed description of the preferred embodiments and method given below, serve to explain the principles of the invention of the drawings.

DETAILED DESCRIPTION OF THE INVENTION

Figure 1A:
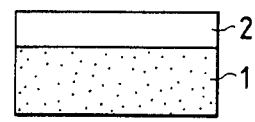
FIGS. 1(a)-(d) illustrate cross-sections showing the successive steps in making an embodiment of the present invention.

Reference will now be made in detail to the presently preferred embodiments and methods of the invention as illustrated in the accompanying drawings, in which like reference characters designate like or corresponding parts throughout the several drawings.

Figure 2:
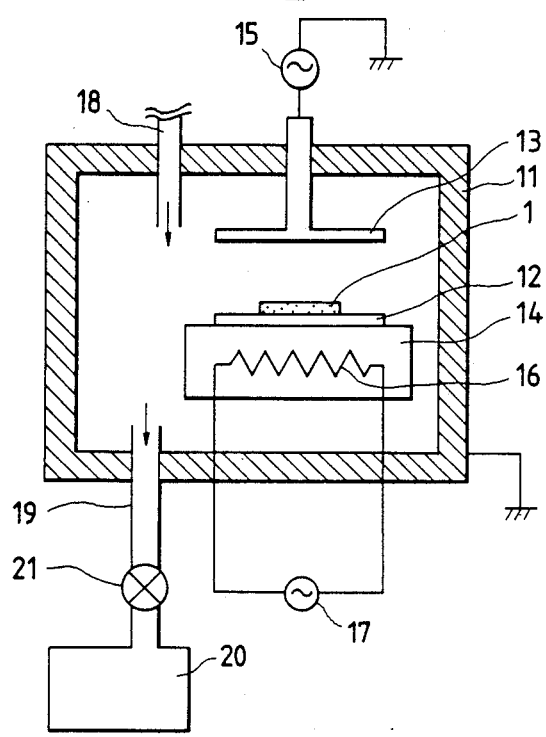
FIG. 2 illustrates a cross-section of an apparatus used for realizing the present invention.

FIG. 2 shows an apparatus for performing plasma CVD hydrogen plasma treatment to be used in an embodiment of the present invention. In a vacuum chamber 11, a lower electrode 12 for supporting a film forming substrate 1 is mounted on a heating mount 14 in opposition to an upper electrode 13. The upper electrode 13 is connected to a high frequency power source 15, and a heater 16, provided in the heating mount 14, is connected to a power source 17. A gas inlet pipe 18 and a gas discharging pipe 19 are opened into the vacuum chamber 11. The discharging pipe 19 is connected to a vacuum pump 20 through a control valve 21.

FIGS. 1(a)-(d) illustrate an embodiments of the present invention utilizing the above apparatus and will now be described by way of example.

First, the glass substrate 1 was mounted on the lower electrode 12, and the control valve 21 was fully opened so that the inside of the vacuum chamber 11 was evacuated by the vacuum pump 20. Next, the heater 16 was turned on, heating the glass substrate 1 to 200-300° C. Further, mono-silane gas and an acetylene gas were led into the vacuum chamber 11 through the gas inlet pipe 18 at flow rates of 10 cc/min and 1 cc/min, respectively. The control valve 21 was adjusted until the pressure in the vacuum chamber was 100 Pa. As a result, the vacuum chamber was filled with a raw material gas composed of mono-silane and acetylene at a partial pressure ratio of 10:1, respectively.

Next, a high frequency electric field was applied to the upper electrode 13 from the high frequency power source 15 having a frequency of 13.56 MHz. This resulted in glow discharge between the upper electrode 13 and the grounded lower electrode 12. The raw material gas was decomposed by the glow discharge, and a carbon doped amorphous silicon thin film was deposited on the glass substrate 1. The deposition rate of the carbon-doped amorphous silicon thin film was 0.05 nm/sec. Therefore, if the high frequency electric field was applied to the upper electrode 13 for 6 seconds, a carbon-doped amorous silicon layer 2 having a thickness of 0.3 nm would have been deposited on the glass substrate 1 as illustrated in FIG. 1(a).

In the next step, the supply of the raw material gas was stopped, and the control valve 21 was fully opened so that the inside of the vacuum chamber 11 was evacuated. Then, hydrogen was led into the vacuum chamber 11 through the gas inlet pipe 18 at a flow rate of 100 cc/min. The control valve 21 was adjusted until the pressure in the vacuum chamber was 100 Pa.

Figure 1B:
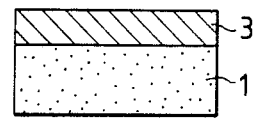

Next, glow discharge was generated in the hydrogen gas for 3 seconds, exposing the carbon-doped amorphous silicon layer 2 to the hydrogen plasma 4 generated by the glow discharge. As a result, the number of defects in the carbon-doped amorphous silicon layer 2 remarkably decreased leaving a low-defect carbon-doped amorphous silicon layer 3 formed on the glass substrate 1 as illustrated in FIG. 1(b).

Figure 1C:
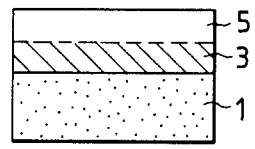
Figure 1D:
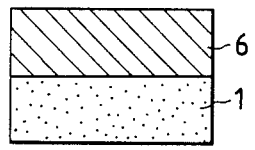

FIG. 1(c) illustrates another carbon-doped amorphous silicon layer 5 having a thickness of 0.3 nm deposited on the defect-reduced carbon-doped amorphous silicon layer 3 using the same process as that described above. FIG. 1(d) illustrates the newly-deposited carbon-doped amorphous silicon layer 5 after being subjected to the hydrogen plasma treatment. This hydrogen plasma treatment reduced the defects in the carbon-doped amorphous silicon layer in the same manner as in the case of the carbon-doped amorphous silicon layer 3. Thus, a defect-reduced carbon-doped amorphous silicon film 6 having a total thickness of 0.6 nm was formed on the glass substrate 1.

The deposition process of the carbon-doped amorphous silicon layer having a thickness of 0.3 nm, and the defect reduction process of the deposited carbon-doped amorphous silicon layer through the hydrogen plasma treatment described above were alternately repeated 1500 times so that a defect-reduced carbon-doped amorphous silicon thin film having a thickness of 0.45 $\mu$m was formed or the glass substrate 1. The optical band gap of the carbon-added amorphous silicon thin film was 2.0 electron volts, and the photoconductivity of the carbon-added amorphous silicon thin film under irradiation of artificial sun light, having intensity of 100 mW/cm$^2$, was $1.0 \times 10^{-5}$ s/cm.

In another example of the present invention in which the hydrogen plasma treatment was performed for more than 4 seconds, it was found that the hydrogen plasma began etching the carbon-doped amorphous silicon thin film. Therefore, even if a carbon-doped amorphous silicon layer of fixed thickness were deposited by one cycle of the carbon-doped amorphous silicon layer deposition step and one cycle of the hydrogen plasma treatment step, the carbon-doped amorphous silicon layer could become thinner depending on the duration of the hydrogen plasma treatment. For example, in the case where the step of depositing a carbon-doped amorphous silicon layer having a thickness of 0.7 nm and the step of performing hydrogen plasma treatment for 12 seconds were alternately repeated 1000 times, the resulting carbon-doped amorphous silicon thin film was 0.3 $\mu$m thick. This means that the carbon-doped amorphous silicon thin film was etched 0.4 nm, during the 12 second hydrogen plasma treatment. In this case, the optical band gap of the resulting thin film was still 2.0 electron volts, and the film's photoconductivity was still $1.0 \times 1.0^{-5}$ S/cm.

The foregoing two examples suggest that the photoconductivity of a carbon-doped amorphous silicon thin film is determined in accordance with the thickness of a carbon-doped amorphous silicon layer formed by performing only one cycle of the carbon-doped amorphous silicon layer depositing step and the hydrogen plasma treatment step. When the relationship between the thickness of the carbon-doped amorphous silicon layer formed by performing the steps once, and the photoconductivity of the carbon-doped amorphous silicon thin film was examined by changing the time for both steps, it was found that the photoconductivity of the resulting carbon-doped amorphous silicon thin film did not depend on the existence of etching due to hydrogen plasma. Instead, the photoconductivity depended only on the thickness of the carbon-doped amorphous silicon layer formed by performing the steps once.

Figure 3:
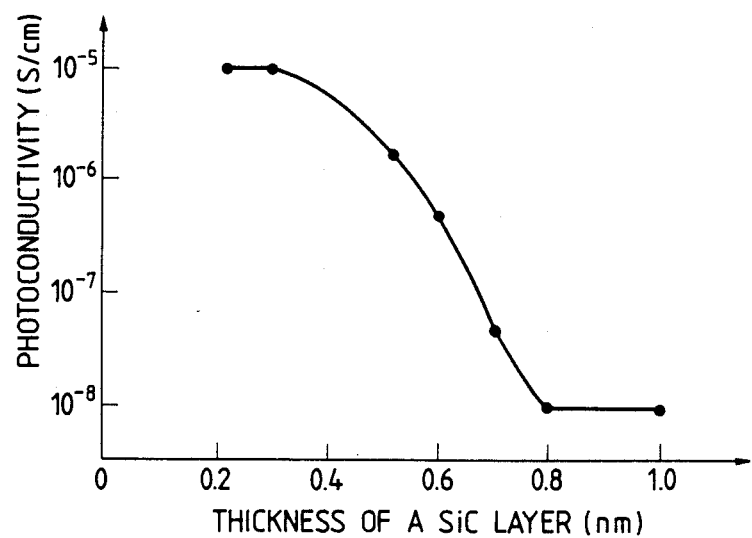
FIG. 3 illustrates the relationship between the thickness of a carbon-doped amorphous silicone layer formed during one execution of the present invention and the photoconductivity of the formed carbon-doped amorphous silicon thin film.

FIG. 3 illustrates the relationship between the thickness and photoconductivity of a carbon-doped amorphous silicon thin film formed by the method used in the foregoing examples and under conditions such that the film's optical band gap is 2.0 electron volts. FIG. 3 shows that a carbon-doped amorphous silicon thin film, having a thickness of 0.6 nm or less, has photoconductivity ten times, or more, higher than an carbon-doped amorphous silicon thin film formed by the conventional method. The improvement of photoconductivity according to the present invention, however, is not recognized in the case of a carbon-doped amorphous silicon thin film having a thickness of 0.8 nm or more.

According to the present invention, the step of depositing a carbon-doped amorphous silicon layer with a thickness substantially the same as that of two monoatomic layers i.e., less than 0.8 nm), and the step of hydrogen plasma treatment are alternately repeated. By utilizing the fact that the number of defects in a carbon-doped amorphous silicon monoatomic layer can be reduced through hydrogen plasma treatment, it is possible to produce a carbon-doped amorphous silicon thin film having photoconductivity several times, or more, higher than a carbon-doped amorphous silicon thin film formed by the conventional method and yet having the same band gap. Therefore, the present invention is extremely effective for improving the characteristics of an amorphous solar battery.

What is claimed is:

1. A method of producing a carbon-doped amorphous silicon thin film upon a substrate comprising the steps of:
   depositing a carbon-doped amorphous silicon layer by plasma assisted chemical vapor deposition upon the substrate, including the substep of generating a glow discharge in a mixture of a silane gas and a hydrocarbon gas; and
   exposing said deposited layer to a plasma in a gas containing hydrogen for achieving a resultant layer having a thickness not greater than 0.8 nm.

2. A method according to claim 1, wherein said substrate is a glass substrate included in an amorphous solar battery.

3. A method according to claim 1, further comprising alternately repeating each said step of depositing and exposing a predetermined number of times for achieving a layer of prescribed thickness.

4. A method according to claim 1, wherein said silane gas is mono silane gas and said gas-containing hydrogen is acetylene gas.

5. A method according to claim 1, wherein the step of exposing said deposited layer includes etching said carbon-doped amorphous silicon thin film for achieving said resultant layer.

* * * * *